United States Patent [19]

Ito

[11] 4,207,531
[45] Jun. 10, 1980

[54] TUNING CONTROL SYSTEM OF RADIO RECEIVER

[75] Inventor: Tatsuo Ito, Kobe, Japan

[73] Assignee: Fujitsu Ten Limited, Kobe, Japan

[21] Appl. No.: 860,379

[22] Filed: Dec. 14, 1977

[30] Foreign Application Priority Data

Dec. 24, 1976 [JP] Japan ................................. 51-157087

[51] Int. Cl.² ............................................. H04B 1/34
[52] U.S. Cl. .................................... 455/164; 455/184; 455/186
[58] Field of Search ............... 325/335, 453, 458, 459, 325/464, 465, 468, 470

[56] References Cited

U.S. PATENT DOCUMENTS

| 3,845,394 | 10/1974 | Hamada | 325/464 |
| 3,940,702 | 2/1976 | Yoshimura et al. | 325/464 |
| 3,965,336 | 6/1976 | Grohmann | 325/470 |
| 3,971,992 | 7/1976 | Saikaishi et al. | 325/464 |
| 3,988,681 | 10/1976 | Schürmann | 325/470 |

Primary Examiner—Marc E. Bookbinder
Attorney, Agent, or Firm—Daniel Jay Tick

[57] ABSTRACT

A tuning control system of a radio receiver comprises a tuning voltage supply circuit which sweeps the received frequency by applying a variable control voltage to a variable reactance element of the tuning circuit and also stops the generation of the control voltage by means of a signal which is generated when a broadcasting signal is received. A memory for preset selection stores a counted value based on the received frequency signal and outputs this stored calculation value as a value corresponding to the desired broadcasting frequency. A digital comparator circuit compares the counted value based on the random receiving frequency signal and the counted output from the memory and generates a selection command signal for the tuning voltage circuit.

1 Claim, 2 Drawing Figures

TUNING CONTROL SYSTEM OF RADIO RECEIVER

BACKGROUND OF THE INVENTION

The present invention relates to a tuning control system of a radio receiver. More particularly, the invention relates to a tuning control system of a radio receiver, which tuning control system permits electronic preset selection.

Tuning of a currently used radio receiver to a desired broadcast frequency is accomplished by changing the inductance or capacitance of a tuning circuit through operation of the tuning knob. Tuning is also provided by previously storing several desired broadcast frequencies via a plurality of push-button mechanisms corresponding to the mechanical position of the inductance or capacitance elements of the tuning circuit, whereby only one of the stored frequencies is mechanically selected.

The latter configuration is well known as the push-button type tuning receiver and is often installed in an automotive vehicle because it permits preset selection. However, the radio receiver of a vehicle must be of small size, and the number of stations for preset selection is limited in a radio receiver in which present operation is performed mechanically, as in a receiver of the latter type, as hereinbefore described. Furthermore, it is usually possible to set only five stations, at the most. For this reason, the push-button mechanism for presetting cannot cover the receiving area when such receiving area changes or spreads out with the movement of the vehicle. In such a case, therefore, the preset condition is once cancelled and setting is then required again. This is very inconvenient. In addition, an automatic tuning receiver is also utilized in the radio receiver of the vehicle, in which tuning receiver a semiconductor variable capacitance element is used for the tuning circuit. A variable control voltage for the variable capacitance element is changed continuously by a potentiometer, and the received frequency is thereby automatically swept and is sequentially tuned to the broadcast frequency.

This type of receiver is very convenient, since all stations within the receiving area may be selected automatically. However, the receiver also has the disadvantage that a considerable time is required for receiving a desired station, when there are many adjacent stations, because tuning is accomplished sequentially, station by station, and includes all stations. Furthermore, it is necessary to operate the selection switch each time the receiver is tuned to a certain station.

As hereinbefore described, the push-button type tuning receiver may immediately select the desired station, but cannot cover the entire receiving area, while the automatic receiver may receive the signal for the entire receiving area, but cannot immediately receive the desired station. Therefore, neither of the receivers hereinbefore mentioned can satisfy the requirements of a vehicular radio receiver, due to their respective advantages and disadvantages.

A tuning control system which eliminates the aforedescribed disadvantages is disclosed in U.S. Pat. No. 4,004,232, issued to Yuji Amaya on Jan. 18, 1977 for Radio Receiver Tuning Control System. In the disclosed tuning control system, a local oscillator signal is extracted from the local oscillator of the receiver and is then converted into a receiving frequency. The converted signal is counted and the counted value is compared with a value corresponding to the desired preset station frequency, digit by digit. The local oscillator is automatically controlled in accordance with the result of the comparison, so that the counted value coincides with the preset value. This is called a digital tuning receiver. The disclosed system may immediately select the desired station over the entire receiving area.

However, the tuning control system disclosed in the United States patent has the disadvantage that presetting is impossible if the desired broadcast frequency is unknown, since the desired broadcast frequency is preset after conversion into binary code via a digital switch, or a value corresponding to the broadcast frequency is stored after conversion into a digital signal via a diode matrix circuit. Furthermore, in the latter case, there is the disadvantage that the preset value cannot be easily corrected.

The principal object of the invention is to provide a tuning control system of a radio receiver, which system may freely preset a desired broadcast frequency.

An object of the invention is to provide a tuning control system of a radio receiver, which system permits easy correction of the preset value.

Another object of the invention is to provide a tuning control system of a radio receiver, which system utilizes a random access memory for presetting a value corresponding to the desired broadcast frequency, thereby reducing the size of the radio receiver by incorporation of electronic preset equipment.

Still another object of the invention is to provide a tuning control system of a radio receiver, which system utilizes electronic preset selection of broadcast frequencies.

BRIEF SUMMARY OF THE INVENTION

In accordance with the invention, the tuning control system of a radio receiver comprises a tuning voltage supply circuit which sweeps the receiving frequency by applying a variable control voltage to the variable reactance element of the tuning circuit. A memory for preset station selection stores the counted value based on the received frequency signal and outputs the stored and counted value as a value corresponding to the desired broadcast frequency. A digital comparator circuit digitally compares the counted value based on a random receiving frequency signal and the counted value output from the memory, and generates a station selection command signal to the tuning voltage supply circuit.

A random access memory utilized as the memory permits free and easy presetting of desired broadcast frequencies.

In accordance with the invention, a tuning control system of a radio receiver comprises a tuning circuit having a variable reactance element. A tuning voltage supply circuit connected to the tuning circuit applies a variable control voltage to the variable reactance element and sweeps the receiving frequencies of the receiver. A counter circuit coupled to the tuning circuit counts the receiving frequency signals. The counter circuit has an output terminal and provides at the output terminal an output corresponding to the count. A digital setting circuit connected to the counter circuit designates a desired broadcast frequency. The digital setting circuit comprises a random access memory for receiving the counted output of the counter circuit corresponding to the receiving frequency when the receiver is tuned as an input signal. The random access memory writes and stores the input signal in itself and provides the stored signal as an output designation signal. A digital comparator circuit has inputs connected to the counter circuit and the digital setting circuit and compares the output of the counter circuit and the output designation signal of the digital setting circuit. The inputs of the digital comparator circuit include a digital setting input terminal. The digital comparator circuit has outputs coupled to the tuning voltage supply circuit and provides at the outputs a sweep signal for the tuning voltage supply circuit.

A write command signal generating circuit has an output terminal coupled to the random access memory for generating a write command signal for starting writing operation of the random access memory.

The random access memory consists of a semiconductor memory device having a write/read signal input terminal coupled to the output terminal of the write command signal generating circuit, a write data signal input terminal connected to the output terminal of the counter circuit, a read data signal output terminal connected to the digital setting input terminal of the digital comparator circuit and a plurality of address signal input terminals. An address designation circuit has output terminals coupled to the address signal input terminals of the random access memory.

The write command signal generating circuit comprises switch means and a first trigger signal generating circuit connected to the switch means for generating a write command signal when the switch means operates.

The write command signal generating circuit comprises a second trigger signal generating circuit for detecting the broadcast signal when it is received and generating a write command signal.

The radio receiver includes a detector and the random access memory includes a write/read signal input terminal. An automatic frequency control circuit connected to the tuning voltage supply circuit detects a DC voltage in accordance with a degree of detuning of the tuning frequency of the detector and provides an output controlling the application of the sweep signal of the tuning voltage supply circuit. A gate circuit has an output connected to the write/read signal input terminal of the random access memory, an input related to the output of the automatic frequency control circuit and another input coupled to the output terminal of the write command signal generating circuit.

The second trigger signal generating circuit comprises a delay circuit which provides a write command signal with a specified delay until the tuning condition of the receiver is stabilized after the broadcast signal is received.

BRIEF DESCRIPTION OF THE DRAWINGS

In order that the invention may be readily carried into effect, it will now be described with reference to the accompanying drawings, wherein:

As shown in FIG. 1, the radio receiver of the invention comprises five sections I to V enclosed by broken lines. The first section I is an ordinary superheterodyne receiver circuit. The second section II is a tuning voltage supply circuit. The third section III is an automatic tuning control circuit, as hereinbefore described. The fourth section IV is a digital tuning control circuit, as disclosed in the U.S. Pat. No. 4,004,232. The fifth section V is an electronic preset tuning control circuit of the invention.

Figure 1:
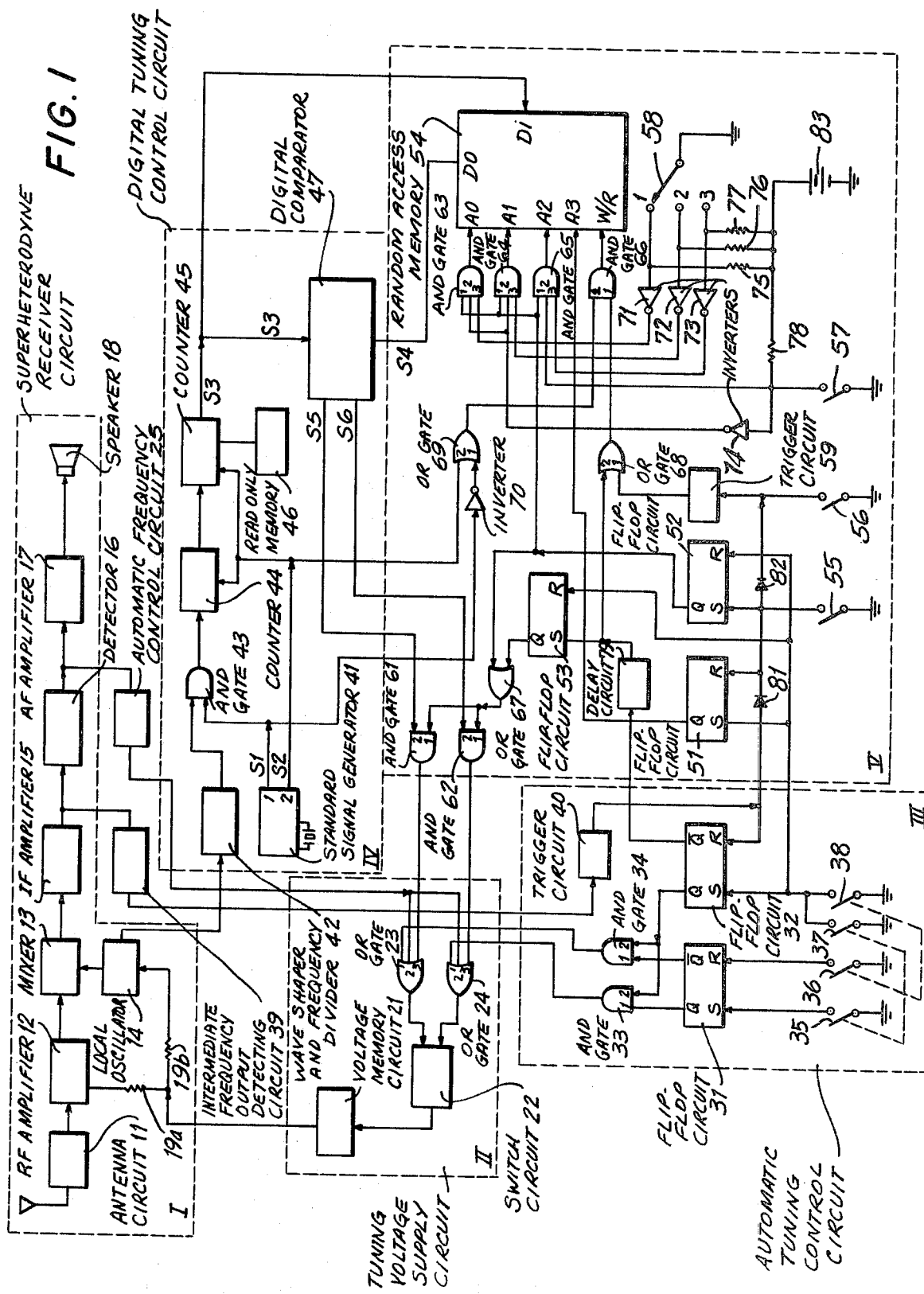
FIG. 1 is a block diagram of an embodiment of the tuning control system of the radio receiver of the invention.

The superheterodyne receiver I provides a signal reproducing system consisting of an antenna circuit 11, a radio frequency (RF) amplifier 12, a frequency converter or mixer 13, a local oscillator 14, an intermediate frequency (IF) amplifier 15, a detector 16, an audio frequency amplifier 17 and a speaker 18. The RF amplifier 12 and the local oscillator 14 are each provided with a variable reactance element, generally a variable capacitance diode, which changes the tuning frequency in accordance with a variable supply voltage. A variable control voltage is applied via resistors 19a and 19b, respectively, and automatically controls the variable capacitance diodes.

The tuning voltage supply circuit II comprises a voltage memory circuit 21, a switch circuit 22 and a pair of OR gates 23 and 24. The circuit components of the tuning voltage supply circuit II are described in U.S. Pat. No. 4,004,232, and are therefore explained briefly herein. The voltage memory circuit 21 gradually increases an output voltage when a positive DC voltage input is provided, and gradually decreases an output voltage when a negative DC voltage input is provided, thereby maintaining the output voltage constant for a long period of time when an input voltage is zero. The switch circuit 22 is connected to positive and negative DC power sources (not shown in the FIGS.) and outputs a positive and negative DC voltage when it is electrically controlled ON and OFF by a control signal from the OR gates 23 and 24. The OR gates 23 and 24 are respectively connected to the automatic tuning control circuit III, the digital tuning control circuit IV and an automatic frequency control (AFC) circuit 25 via the inputs of said OR gates, and any one of the sweep signals from these circuits is selectively provided as input. As is well known, the AFC circuit 25 is connected to the detector 16 and generates an output in accordance with the degree of detuning.

The automatic tuning control circuit III comprises a pair of flip flop (FF) circuits 31 and 32, a pair of AND gates 33 and 34, a pair of sweep direction designation switches 35 and 36, a pair of sweep start designation switches 37 and 38, an intermediate frequency (IF) output detecting circuit 39 and a trigger circuit 40.

The first flip flop circuit 31 of the automatic tuning control circuit designates the ascending or descending frequency sweep direction of automatic tuning. The set terminal S of the first flip flop circuit 31 is connected to the descending direction designating switch 35, and the reset terminal R of said flip flop circuit is connected to the ascending direction designation switch 36. The two output terminals Q and $\overline{Q}$ of the first flip flop 31 are connected to the input terminals 1 of the AND gates 33 and 34, respectively.

The second flip flop circuit 32 of the automatic tuning control circuit designates the start and stop of automatic tuning. The set terminal S of the second flip flop circuit 32 is connected to the two sweep start designation switches 37 and 38, and the reset terminal R of said flip flop circuit is connected to the output terminal of the trigger circuit 40. The output terminal Q of the second flip flop circuit 32 is connected to the input terminals 2 of the AND gates 33 and 34, respectively, and the output terminal $\overline{Q}$ of said second flip flop circuit is connected to a delay circuit 79, hereinafter described, of the electronic preset tuning control circuit V. The output terminal of the AND gate 33 is connected to the input terminal 1 of the OR gate 24 and the output terminal of the AND gate 34 is connected to the input terminal 1 of the OR gate 23.

The aforedescribed IF output detecting circuit 39 detects an IF output which is generated when the receiver tunes to a certain frequency and then outputs a logical level signal. A differentiation circuit is used as the trigger circuit 40. The differentiation circuit produces an output pulse signal of several msec with an input of the logical level signal. The descending direction designation switch 35 and the sweep start designation switch 37 are interlocked or ganged and operated jointly and the ascending direction designation switch 36 and the sweep start designation switch 38 are interlocked or ganged and operated jointly. These switches are usually open, and close only when depressed.

The digital tuning control circuit IV is explained briefly, since it is described in U.S. Pat. No. 4,004,232. The digital tuning control circuit IV comprises a standard signal generator 41, a waveform shaper frequency divider 42, an AND gate 43, counters 44 and 45, a read only memory 46 and a digital comparator 47. The standard signal generator 41 includes a crystal controlled oscillation circuit. The oscillation circuit provides a positive pulse gate signal S1 with pulse period of 10 msec and a pulse width of 1 msec. The oscillation circuit also provides a negative pulse reset signal S2 which has the same pulse period and pulse width as the gate signal S1 and precedes said gate signal by 1 msec.

The wave shaper and frequency divider circuit 42 shapes the local oscillator signal supplied by the local oscillator circuit 14 and divides the frequency as required. The frequency is divided into 1/10 only in an FM receiver. The AND gate 43 samples the local oscillator pulse signal which is shaped by the gate signal S1. The counter 44 divides the sampled pulse signal into 1/10. In an AM receiver, the output pulse of the counter 44 corresponds to a frequency spacing of 10 kiloHertz or kHz, while in an FM receiver, said output pulse corresponds to a frequency spacing of 100 kHz. These frequency spacings correspond to the channel separation in Japanese AM broadcasting and FM broadcasting, respectively.

A presettable counter is utilized as the counter 45. The counter is preset to a specified value, so that an initial zero state of all bits may be obtained when the pulses corresponding in number to the lowest frequency of the broadcast frequency band are supplied as the input. An output signal S3 of 8 bits indicates the currently received frequency, that is, the receiving frequency. Therefore, when the counted output is supplied to a proper indicator, such indicator provides a visual indication of the receiving frequency.

The read only memory 46 stores the preset value corresponding to the lowest frequency of the broadcast frequency band. The preset operation is started by the reset signal S2.

The digital comparator circuit 47 compares the 8 bit output signal S3 of the counter 45 and the output of the digital designation circuit, which is a value corresponding to the desired broadcast frequency, which is, in the present invention, the read out data output S4 of the random access memory hereinafter described. The digital comparator circuit 47 then outputs the logical level signals S5 and S6 indicated in the following table.

| Input | Output | |
|---|---|---|
| | S5 | S6 |
| S3 > S4 | 0 | 1 |
| S3 < S4 | 1 | 0 |
| S3 = S4 | 0 | 0 |

In the foregoing table, 0 is the low level, while 1 is the high level.

The electronic preset tuning control circuit V, which characterizes the invention, comprises a plurality of flip flop (FF) circuits 51, 52 and 53, a random access memory 54, a plurality of switches 55, 56, 57 and 58, a trigger circuit 59, a plurality of AND gates 61, 62, 63, 64, 65 and 66, a plurality of OR gates 67, 68 and 69, a plurality of inverters 70, 71, 72, 73 and 74, a plurality of resistors 75, 76, 77 and 78 and a delay circuit 79.

The third flip flop circuit 51 designates the address of the random access memory 54 during automatic tuning control. The set terminal S of the third flip flop circuit 51 is connected to the sweep start designation switches 37 and 38, the reset terminal R of said flip flop circuit is connected to the trigger circuit 40 via a diode 81, and the output terminal Q of said flip flop circuit is connected to the address signal input terminal A3 of the random access memory 54.

The fourth flip flop circuit 52 is provided for switching control of the automatic tuning and digital tuning. The set terminal S of the fourth flip flop circuit 52 is connected with the preset station selection switch 56 via a diode 82, the reset terminal R of said flip flop circuit is connected to the sweep start designation switches 37 and 38, and the output terminal Q of said flip flop circuit is connected to the input terminal 1 of the AND gates 63, 64 and 65 and to the input terminal 1 of the OR gate 67. Furthermore, the reset terminal R of the third flip flop circuit 51 and the set terminal S of the fourth flip flop circuit 52 are connected to the digital tuning designation switch 55. The designation switch 55 closes the contacts during digital tuning.

The fifth flip flop circuit 53 is provided for operation control of the digital tuning. The set terminal S of the fifth flip flop circuit 53 is connected to the output terminal of the delay circuit 79, the reset terminal R of said flip flop circuit is connected to the sweep start designation switches 37 and 38 and the output terminal Q of said flip flop circuit is connected to the input terminal 2 of the OR gate 67.

As is well known, the random access memory 54 is a metal oxide semiconductor (MOS) and operates on the principle that a plurality of memory cells permit read and write operations at any time. More particularly, the random access memory 54 provides a plurality of address signal input terminals, four external connection terminals A0, A1, A2 and A3, a write/read signal input terminal W/R, a write data input terminal Di and a read data signal output terminal D0. When the write control command signal is input to the write/read signal input terminal W/R, the random access memory 54 inputs the 8 bit output signal S3 of the counter 45 at the write data signal input terminal Di and then writes it. Furthermore, when the address signal is input to the address signal terminals A0, A1, A2 and A3, while the read command signal is input to the write/read signal input terminal W/R, the random access memory 54 provides an 8 bit logical signal at the read data signal output terminal D0. The output signal at the terminal D0 is also supplied to the digital comparator circuit 47.

A differential circuit is used as the trigger circuit 59. The input terminal of the trigger circuit 59 is connected to the preset selection setting switch 56. When the preset selection setting switch 56 closes, a pulse of several msec is generated by the trigger circuit 59 and is applied to the input terminal 1 of the OR gate 68 as a write command signal. The input terminal 2 of the OR gate 68 is connected to the output terminal of the delay circuit 79 and the output terminal of said OR gate is connected to the input terminal 1 of the AND gate 66. The output terminal of the AND gate 66 is connected to the write/read signal input terminal W/R of the random access memory 54 and the input terminal 2 of said AND gate is connected to the output terminal of the OR gate 69.

The OR gate 69 functions to close the AND gate 66 while operation of the random access memory 54 is unstable, or during reset or preset of the counters 44 and 45, in order to prevent mis-operation of said memory. Therefore, the input terminal 1 of the OR gate 69 is connected to the gate signal output terminal 1 of the standard signal generator 41 via the inverter 70 and the input terminal 2 of said OR gate is connected to the reset signal output terminal 2 of said signal generator.

The delay circuit 79 functions to delay the output of the second flip flop circuit 32, to be used as the write/read command signal of the random access memory 54, for a certain period. In the disclosed embodiment of the invention, the delay period extends until the receiving frequency becomes stable by means of the AFC function after the automatic tuning. The delay operation is one of the important operations of the invention, since the random access memory 54 always permits writing of the counter output corresponding to the stabilized receiving frequency. The AND gates 61 and 62 open their gates only when there is digital tuning control. The input terminals 1 of the AND gates 61 and 62 are connected to the output terminal of the OR gate 67. The input terminals 2 of the AND gates 61 and 62 are connected to the output terminals of the digital comparator 47. The output terminals of the AND gates 61 and 62 are connected to the input terminals 3 of the OR gates 23 and 24, respectively.

The inverters 71, 72 and 73 designate the address signal of the random access memory 54, that is, they designate a channel of the digital tuning. The input terminals of the inverters 71, 72 and 73 are connected to the fixed contacts 1, 2 and 3, respectively, of the channel changeover switch 58 and are connected to a DC power supply or battery 83 via the resistors 75, 76 and 77, respectively. The output terminals of the inverters 71, 72 and 73 are connected to the input terminal 3 of the AND gates 63, 64 and 65, respectively.

The inverter 74 functions to switch the AM broadcast and the FM broadcast. The input terminal of the inverter 74 is connected to the DC power supply 83 via the resistor 78 and to the AM/FM changeover switch 57. The output terminal of the inverter 74 is connected to the input terminal 2 of the AND gates 63 and 64. When closed, the changeover switch 57 may select the desired AM station broadcast. The AND gate 65 is the logical gate for FM broadcasting only. The input terminal 2 of the AND gate 65 is connected to the resistor 78 and to the switch 57 and the output terminal of said AND gate is connected to the address signal input terminal A2 of the random access memory 54. The AND gates 63 and 64 are logical gates for AM broadcasting only. The output terminals of the AND gates 63 and 64 are connected to the address signal input terminals A0 and A1, respectively, of the random access memory 54.

The operation of the tuning control system of the invention is explained by reference to FIG. 1. As hereinbefore described, the receiver of the invention is capable of realizing two types of tuning controls, automatic tuning and digital tuning. Of course, these two functions are locked by the switch and flip flop circuit, and therefore only one function is effective at a time. The automatic tuning control is explained first.

When the descending direction designation switch 35 is depressed and, as a result, the contacts close, the sweep start designation switch 37 also closed in conjunction with the switch 35. The first and second flip flop circuits 31 and 32, respectively, thus operate and the output terminal Q of each of said flip flops becomes high level, while the output terminal $\overline{Q}$ of each of said flip flops becomes low level. Thus, both input terminals of the AND gate 33 become high level and, as a result, the output terminal of said AND gate becomes high level. The high level output signal of the AND gate 33 passes the OR gate 24 and then enters the corresponding input terminal of the switch circuit 22. The switch circuit 22 therefore generates a negative DC voltage and applies it to the voltage memory circuit 21. As a result, the output voltage of the voltage memory circuit 21 decreases and the control voltage of the variable capacitance diode of the local oscillator circuit 14 also decreases, causing the signal level of said local oscillator to decrease.

Actually, the RF signal is also controlled for a time. The RF signal control is omitted, however, in order to simplify the explanation. When the broadcast signal is received in the frequency sweeping condition, the IF output detector 39 generates an output and such output operates the trigger circuit 40, resulting in a pulse signal output. The second flip flop circuit 32 inverts the output condition when this pulse signal is provided as an input. The output terminal Q of the second flip flop circuit 32 is thereby set at the low level, while the output terminal $\overline{Q}$ of said flip flop circuit is set at the high level. The switch circuit 22 is accordingly switched OFF, stopping the control for automatic tuning.

When the broadcasting signal is the desired one, no further operation is required. In such condition, the desired broadcast program may be reproduced from the speaker 18. If it is not the desired broadcast program, repeated operation of the switch 35 or 37 is necessary. As a result, the output condition of the second flip flop circuit 32 is inverted again and the frequency sweep is restarted in the descending direction.

On the other hand, when the ascending direction designation switch 36 is depressed and the contact thereby closes, the contact of the sweep start designation switch 38 also closes in conjunction with such operation. For this reason, the first and second flip flop circuits 31 and 32 operate whereby the output terminal Q of the flip flop circuit 31 becomes low level and the output terminal $\overline{Q}$ of the flip flop 31 becomes high level, while the output terminal Q of the flip flop circuit 32 becomes high level and the output terminal $\overline{Q}$ of the flip flop circuit 32 becomes low level. As a result, the output terminal of the AND gate 34 becomes high level, and since the high level signal passes the OR gate 23 and enters the switch circuit 22, said circuit switch provides a positive DC output voltage. The output voltage level of the voltage memory circuit 21 thereby increases and therefore the control voltage for the variable capacitance diode increases, raising the signal level of the local oscillator 14.

During the aforedescribed automatic tuning control, the counter 45 receives a pulse signal with a spacing of 10 kHz for AM or 100 kHz for FM from the counter 44. When this input coincides with the value corresponding to the lowest frequency 525 kHz or 76 mHz of the AM or FM broadcasting frequency band (Nippon radio broadcasting), an output may be obtained. Thereafter, the decimal numbers 1, 2, . . . which indicate the frequencies 535, 545 kHz . . . or 76.1, 76.2 mHz . . . are output as a binary number of 8 bits every time one pulse is input. This counted output is supplied to both the digital comparator 47 and the random access memory 54.

At such time, the random access memory 54 inputs the address signal to the input terminal A3 by means of the output of the third flip flop circuit 51. However, since there is no write control command signal, the output of the counter 45 is not written. Furthermore, the fourth and fifth flip flop circuits 52 and 53, respectively, are reset by the sweep start designation switch 37 or 38. At such time, since the output terminal Q is at the low level, the output terminals of the OR gate 67 and the AND gates 61 and 62 become low level. Therefore, the digital tuning control is stopped.

After the automatic tuning control, the AFC circuit 25 operates and seizes the broadcasting signal by correcting the receiving frequency. At the same time, the delay circuit 79 generates a trigger pulse which corresponds to the output of the second flip flop circuit 32 after the period in which the receiving frequency is stabilized by the AFC function. The generated trigger pulse sets the fifth flip flop circuit 53 as the write command signal. On the other hand, the trigger pulse sets the output terminals of the OR gate 68 and the AND gate 66 to the high level. Thereafter, the trigger pulse is input to the write/read signal input terminal W/R of the random access memory 54. The random access memory 54 writes the 8 bit binary signal corresponding to the present 8 bit output of the counter, that is, the receiving frequency, by means of the command signal.

At such time, since the output of the third flip flop circuit 51 is input to the address signal input terminal A3 of the random access memory 54 as the address signal, the 8 bit binary signal written previously is provided as an output at the read data signal output terminal D0 of said memory. This output indicates the desired broadcasting signal and is input to the digital comparator 47. The digital comparator 47 digitally compares the input provided by the random access memory 54 and the input provided by the counter 45. In this case, however, since both inputs to the comparator 47 coincide, both outputs S5 and S6 of said comparator become low level, as obvious from the aforeshown table.

The AND gates 61 and 62 receive the high level output of the fifth flip flop circuit 53 at their input terminals 1, via the OR gate 67, and are, as a result, set to the digital tuning control state. Furthermore, the AND gates 61 and 62 control the switch circuit 22 and the voltage memory circuit 21, as in automatic tuning, in accordance with the outputs S5 and S6 of the digital comparator 47 supplied to the input terminals 2 of said AND gates. However, in this case, since both outputs S5 and S6 are at the low level, this control is not executed.

As hereinbefore explained, the receiver of this type receives the broadcast signal by means of the automatic tuning control and then continuously receives the signal via the digital tuning control system. At such time, the broadcast signal is rewritten for each operation of the automatic tuning control at the fourth address of the random access memory 54.

The operation of writing the broadcast frequency received by the automatic tuning control into the other address, the channel writing operation or preset operation, during digital setting, is explained as follows. This operation may be accomplished by means of the preset selection setting switch 56 and the channel changeover switch 58. In other words, when the movable contact of the changeover switch 58 makes contact with the fixed contact 1 of said switch, for example, a divided voltage of the power source 83 applied to the input terminal of the inverter 71 is grounded. The output terminal of the inverter 71 thus becomes high level.

Thereafter, when the setting switch 56 is depressed, and the next contact closes, the trigger circuit 59 operates and generates a trigger pulse. Furthermore, the fourth flip flop circuit 52 is set and a high level signal is generated at the output terminal Q of said flip flop. In addition, the second and third flip flop circuits 32 and 51 are reset. The aforedescribed trigger pulse is input to the write/read signal input terminal W/R of the random access memory 54 via the OR gate 68 and the AND gate 66 as the write command signal. The output of the fourth flip flop circuit 52 passes the OR gate 67 and then is applied to the input terminals 1 of the AND gates 61 and 62 thereby setting the digital tuning control condition. On the other hand, the output of the fourth flip flop circuit 52 is provided as input of the input terminal 1 of the AND gates 63, 64 and 65.

If the contact of the AM/FM changeover switch 57 closes and is set to the AM side, the output of the inverter 74 becomes high level and is input to the AND gates 63 and 64 as the address signal. Therefore, since the input terminals of the AND gate 63 become high level, the first address A0 of the random access memory 54 is selected. Thus, in this address, the 8 bit output of the counter 45, corresponding to the broadcasting frequency received by the automatic tuning control, is written. As hereinbefore explained, different broadcasting frequencies for digital tuning are sequentially written respectively in the plurality of addresses of the random access memory 54 by the operations of the channel changeover switch 58 and the preset selection setting switch 56.

The operation of reading the broadcast frequency written in the random access memory 54 and executing the digital tuning control is explained as follows. The operation of reading the broadcast frequency may be realized by depressing the digital tuning designation switch 55 under the condition that the channel changeover switch 58 is being switched to the desired channel. In other words, when the designation switch 55 is depressed, so that its contacts close, the fourth flip flop circuit 52 is set and a high level output may be obtained from the output terminal Q of said flip flop. As hereinbefore explained, the high level output is provided as input to the input terminal 1 of the AND gates 61 and 62, setting the digital tuning control condition. The high level output of the fourth flip flop circuit 52 is simultaneously provided as input to the input terminal 1 of the AND gates 63, 64 and 65, designating the address.

In this instance, if the channel changeover switch 58 is set to the first channel, for example, the output terminal of the AND gate 63 becomes high level, as hereinbefore described, and the first address is designated for the random access memory 54. On the other hand, the second flip flop circuit 32 is reset via the designation switch 55 and a high level output is generated at the output terminal $\overline{Q}$ of said flip flop circuit. This output is delayed for a specified period by the delay circuit 79, as the read command signal, and then enters the write-/read signal input terminal W/R of the random access memory 54 after having passed the OR gate 68 and the AND gate 66. As a result, the data signal S4 indicating the broadcast frequency such as, for example, 1200 kHz, written in the first address, is read out and then provided as input to the digital comparator 47.

If the counter 45 is then supplying the counted output indicating a receiving frequency of 1350 kHz to the digital comparator 47, a comparison input of said comparator 47 shows the relation such as S3>S4 and the comparison output S6 becomes high level. The AND gate 62 thereby operates and generates a high level output. The output of the AND gate 62 is input to the switch circuit 22 via the OR gate 24. The switch circuit 22 thus generates a negative DC voltage and said negative voltage decreases the output voltage level of the voltage memory circuit 21. As hereinbefore mentioned, the receiving frequency thereby gradually decreases.

Thus, when the receiving frequency becomes 1200 kHz, the comparison input of the digital comparator 47 coincides, since S3 equals S4, and both comparison outputs S5 and S6 become low level. As a result, the AND gate 62 closes and the digital tuning control operation is completed. A similar operation is thereafter undertaken for selecting the second and third channels.

Figure 2:
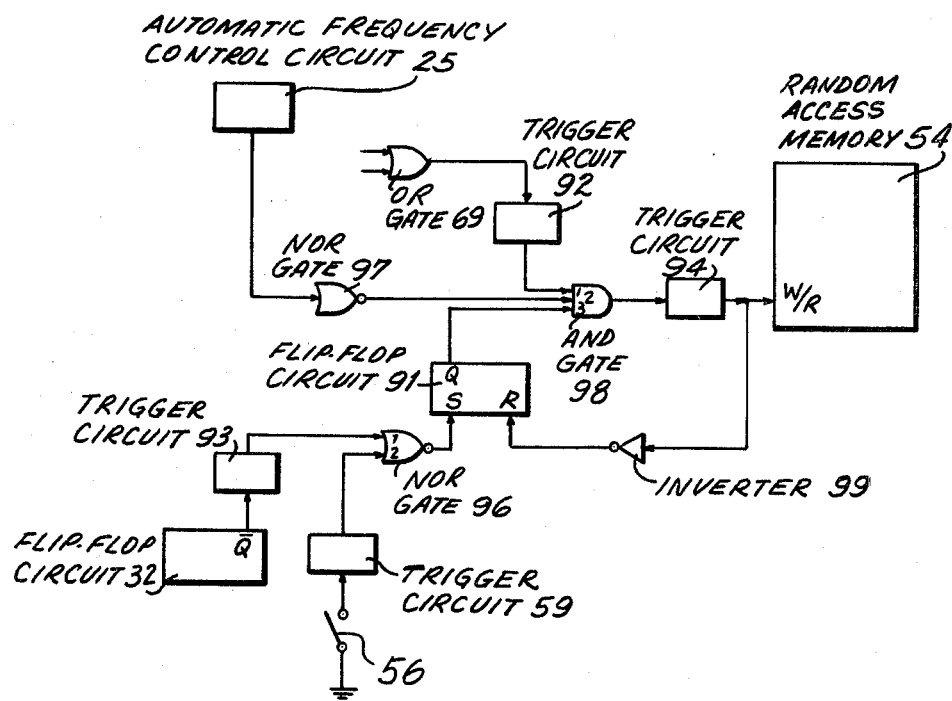
FIG. 2 is a block diagram of part of another embodiment of the tuning control system of the invention.

FIG. 2 is a block diagram of part of another embodiment of the tuning control system of the invention. The embodiment of FIG. 2 is a write operation control circuit for determining the write operation start of the random access memory 54, which may be replaced by the delay circuit 79 of FIG. 1. In FIG. 2, the same components as those of FIG. 1 are indicated by the same reference numerals. The control circuit of FIG. 2 comprises a flip flop (FF) circuit 91, a plurality of trigger circuits 92, 93 and 94, a pair of NOR gates 96 and 97, and AND gate 98 and an inverter 99.

In the write operation control circuit of FIG. 2, the third trigger circuit 92 is connected to the output terminal of the OR gate 69, which is that of FIG. 1. The OR gate 69 provides an output signal while operation of the counters 44 and 45 of FIG. 1 is stabilized. The trigger circuit 92 provides a trigger output pulse by receiving the aforedescribed output and provides such trigger pulse to the input terminal 1 of the AND gate 98.

The fourth trigger circuit 93 is connected to the output terminal $\overline{Q}$ of the second flip flop circuit 32 of FIG. 1. The second flip flop circuit 32 provides an output signal while the broadcast signal is being received. The fourth trigger circuit 93 receives the output signal from the output terminal $\overline{Q}$ of the second flip flop circuit 32 and then outputs a trigger pulse to the input terminal 1 of the NOR gate 96.

The input terminal 2 of the NOR gate 96 is connected to the output terminal of the second trigger circuit 59 of FIG. 1, and the output terminal of said NOR gate is connected to the set terminal S of the sixth flip flop circuit 91. The output terminal Q of the sixth flip flop circuit is connected to the input terminal 3 of the AND gate 98. The NOR gate 97 generates a high level output when the automatic frequency control is not operated and provides such output as an input to the input terminal 2 of the AND gate 98.

The fifth trigger circuit 94 receives a high level output of the AND gate 98 as an input and provides an output trigger pulse. Since the trigger pulse provided by the fifth trigger circuit indicates the write command signal itself of the random access memory 54, said memory starts the write operation when said signal is input. The inverter 99 resets the sixth flip flop circuit 91 by receiving the write command signal in order to get ready for the next write operation by itself.

As is clear from the foregoing description, in accordance with the tuning control system of the invention, the desired broadcast frequency may be preset freely and easily by monitor personnel. Furthermore, since a random access memory is utilized as the preset station selection means, the system itself may be drastically reduced in size and provided as a compact unit. Therefore, the tuning control system of the invention is very well suited for use in the radio receiver of an automotive vehicle.

While the invention has been described by means of specific examples and in specific embodiments, I do not wish to be limited thereto, for obvious modifications will occur to those skilled in the art without departing from the spirit and scope of the invention.

I claim:

1. A tuning control system of a radio receiver, said radio receiver including a detector, said tuning control system comprising a tuning circuit having a variable reactance element;

a tuning voltage supply circuit connected to the tuning circuit for applying a variable control voltage to the variable reactance element and for sweeping the receiving frequencies of the receiver;

a counter circuit coupled to the tuning circuit for counting the receiving frequency signals, said counter circuit having an output terminal and providing at said output terminal an output corresponding to the count;

a digital setting circuit connected to the counter circuit for designating a desired broadcast frequency, said digital setting circuit comprising a random access memory for receiving the counted output of said counter circuit corresponding to the receiving frequency when the receiver is tuned, said random access memory writing and storing said input signal in itself and providing the stored signal as an output designation signal, said random access memory including a write/read signal input terminal;

a digital comparator circuit having inputs connected to the counter circuit and the digital setting circuit for comparing the output of said counter circuit and the output designation signal of said digital setting circuit, said digital comparator circuit having outputs coupled to the tuning voltage supply circuit and providing at said outputs a sweep signal for said tuning voltage supply circuit;

a write command signal generating circuit having a trigger generating circuit for detecting the broadcast signal when it is received and generating a write command signal and an output terminal coupled to the random access memory for generating a write command signal for starting writing operation of said random access memory, said random access memory consisting of a semiconductor memory device having a write/read signal input terminal coupled to the output terminal of said write command signal generating circuit, a write data signal input terminal connected to the output terminal of the counter circuit, a read data signal output terminal connected to the digital setting input terminal of the digital comparator circuit and a plurality of address signal input terminals;

an address designation circuit having output terminals coupled to the address signal input terminals of said random access memory;

an automatic frequency control circuit connected to the tuning voltage supply circuit for detecting a DC voltage in accordance with a degree of detuning of the tuning frequency of the detector and providing an output controlling the application of the sweep signal of the tuning voltage supply circuit; and a gate circuit having an output connected to the write/read signal input terminal of said random access memory, an input related to the output of said automatic frequency control circuit and another input coupled to the output terminal of the write command signal generating circuit.

* * * * *